(12) United States Patent
Abou-Khalil et al.

(10) Patent No.: US 8,669,146 B2
(45) Date of Patent: Mar. 11, 2014

(54) SEMICONDUCTOR STRUCTURES WITH THINNED JUNCTIONS AND METHODS OF MANUFACTURE

(75) Inventors: Michel J. Abou-Khalil, Essex Junction, VT (US); Robert J. Gauthier, Jr., Hinesburg, VT (US); Tom C. Lee, Essex Junction, VT (US); Junjun Li, Williston, VT (US); Souvick Mitra, Essex Junction, VT (US); Christopher S. Putnam, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 420 days.

(21) Appl. No.: 13/005,560

(22) Filed: Jan. 13, 2011

(65) Prior Publication Data

US 2012/0181608 A1    Jul. 19, 2012

(51) Int. Cl.
*H01L 21/336* (2006.01)

(52) U.S. Cl.
USPC ......... 438/151; 438/161; 438/163; 438/164; 257/E21.409

(58) Field of Classification Search
USPC ............. 438/151, 164; 257/E21.409
See application file for complete search history.

(56) References Cited

U.S. PATENT DOCUMENTS

| | | | |
|---|---|---|---|
| 4,752,814 A | 6/1988 | Tuan | |
| 5,504,362 A | 4/1996 | Pelella et al. | |
| 5,889,331 A | 3/1999 | Bai | |
| 6,300,649 B1 | 10/2001 | Hu et al. | |
| 6,300,662 B1 | 10/2001 | Doyle et al. | |
| 6,331,726 B1 | 12/2001 | Voldman | |
| 6,420,218 B1 | 7/2002 | Yu | |
| 6,426,244 B2 | 7/2002 | Hargrove et al. | |
| 7,253,086 B2 | 8/2007 | Hall | |
| 7,253,482 B2 | 8/2007 | Zhu et al. | |
| 7,560,758 B2 | 7/2009 | Zhu et al. | |
| 7,696,024 B2 * | 4/2010 | Maruyama et al. | 438/151 |
| 7,729,096 B2 | 6/2010 | Hayashi | |
| 2002/0034841 A1 * | 3/2002 | Lee | 438/149 |
| 2005/0003627 A1 * | 1/2005 | Abbott et al. | 438/404 |
| 2007/0228482 A1 | 10/2007 | Wei et al. | |
| 2007/0278524 A1 | 12/2007 | Hall | |
| 2009/0218633 A1 | 9/2009 | Hoentschel et al. | |
| 2010/0001347 A1 | 1/2010 | Sugiura | |

FOREIGN PATENT DOCUMENTS

| | | |
|---|---|---|
| WO | WO2006044731 A2 | 4/2006 |
| WO | WO2006044731 A3 | 4/2006 |
| WO | WO2007126495 | 11/2007 |

* cited by examiner

*Primary Examiner* — Angel Roman
(74) *Attorney, Agent, or Firm* — Richard Kotulak; Roberts Mlotkowski Safran & Cole, P.C.

(57) ABSTRACT

A method of forming a semiconductor structure, including forming a channel in a first portion of a semiconductor layer and forming a doped extension region in a second portion of the semiconductor layer abutting the channel on a first side and abutting an insulator material on a bottom side. The first portion of the semiconductor layer is thicker than the second portion of the semiconductor layer.

15 Claims, 10 Drawing Sheets

SEMICONDUCTOR STRUCTURES WITH THINNED JUNCTIONS AND METHODS OF MANUFACTURE

FIELD OF THE INVENTION

The invention relates to semiconductor structures and methods of manufacture and, more particularly, to semiconductor structures having thinned junctions and silicide blocking in order to provide increased sheet resistance and reduced capacitance.

BACKGROUND

Electrostatic discharge (ESD) is sudden and momentary electric current that flows between two objects at different electrical potentials caused by direct contact or induced by an electrostatic field. ESD is a serious issue in solid state electronics, such as integrated circuits. For example, integrated circuits are made from semiconductor materials such as silicon and insulating materials such as silicon dioxide and either of these materials can suffer permanent damage when subjected to high voltages. As a result, there are now a number of structures that help protect against ESD in integrated circuits.

ESD protection in past silicon on insulator (SOI) technologies relied on the use of poly-bound diodes. However, in advanced SOI technologies, the use of a standard "double diode" ESD protection structure is no longer sufficient for a number of reasons: (1) input/output operating voltages of devices are larger, (2) the devices fail at lower voltages, and (3) higher frequency input/outputs of the devices require lower capacitance solutions.

Field-effect transistors (FETs) with silicide blocking on the source and drain provide an alternative solution that meets the requirements of some input/output designs of these devices. In certain SOI processes, nitride used for the silicide blocking is shared with a spacer nitride. In particular, only extension and halo implants occur in the area blocked by silicide formation, which is an advantage for ESD protection, since this design increases the sheet resistance in the silicide blocked region. Specifically, a smaller silicide blocking length can be used to achieve the desired sheet resistance.

FETs created in this process with a single silicide blocking mask shape that extends from the drain to the source provides good ESD characteristics. However, this configuration is disadvantageous because (1) the configuration causes a significant increase in capacitance at the interface between the extensions and the P-well, which is undesirable in high speed input/output designs, and (2) the silicide blocking prohibits the ability to silicide the gate for enhanced electrical contact.

Accordingly, there exists a need in the art to overcome the deficiencies and limitations described hereinabove.

SUMMARY

In a first aspect of the invention, there is a method of forming a semiconductor structure including: forming a channel in a first portion of a semiconductor layer and forming a doped extension region in a second portion of the semiconductor layer abutting the channel on a first side and abutting an insulator material on a bottom side. The first portion of the semiconductor layer is thicker than the second portion of the semiconductor layer.

In another aspect of the invention, a method of forming a semiconductor structure includes: forming a channel in a first portion of a semiconductor layer under a gate of a field effect transistor (FET), forming a source and a drain in the semiconductor layer, forming a first doped extension region in a second portion of the semiconductor layer, on an insulator material, and abutting the channel and the source, forming a second doped extension region in a third portion of the semiconductor layer, on the insulator material, and abutting the channel and the drain. The first portion of the semiconductor layer is thicker than the second and third portions of the semiconductor layer.

In yet another aspect of the invention, a semiconductor structure includes: a channel in a first portion of a semiconductor layer under a gate of a field effect transistor (FET); a doped extension in a second portion of the semiconductor layer; a source or a drain contacting a first side of the doped extension; and a silicide-blocking structure on the doped extension. The first portion of the semiconductor layer is thicker than the second portion of the semiconductor layer. The doped extension is directly on an insulator material. The channel comprises a first dopant type. The doped extension comprises a second dopant type different from the first dopant type. The channel contacts a second side of the doped extension opposite the first side.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the semiconductor structure, which comprises the structures of the present invention. In still further embodiments, a method in a computer-aided design system is provided for generating a functional design model of the semiconductor structure. The method comprises generating a functional representation of the structural elements of the semiconductor structure.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and methods of manufacture and, more particularly, to semiconductor structures having thinned junctions and silicide blocking in order to provide increased sheet resistance and reduced capacitance. In embodiments, doped extension regions are bounded by a dielectric material rather than an oppositely doped semiconductor material, which minimizes the extent of a capacitance-causing interface between the extension regions and oppositely doped semiconductor material. The extension regions may be formed relatively thin e.g., compared to the layer of material in which the channel, source and drain are formed, in order to increase the sheet resistance of the extension regions. This increased sheet resistance improves ESD performance of the device.

In accordance with additional aspects of the invention, a silicide blocking film extends over the extension regions but not over a gate. This avoids an unwanted decrease in the sheet resistance of the extension regions by blocking the formation of silicide on these regions, while also permitting silicide formation on the un-blocked gate.

Figure 1A:
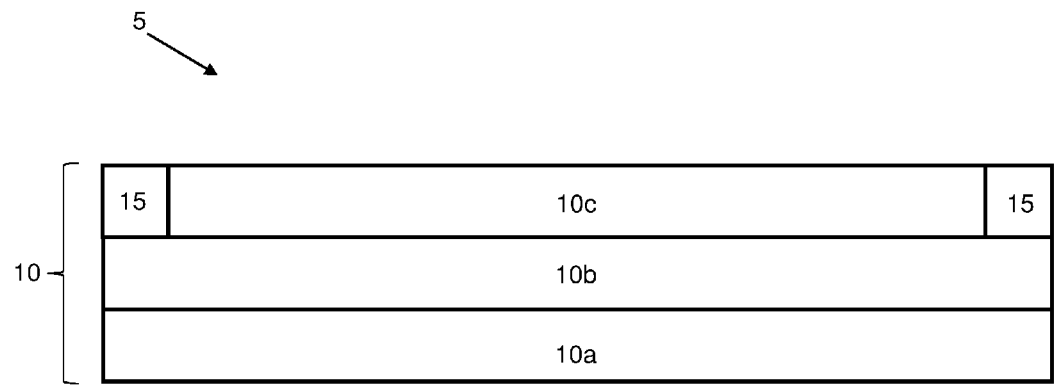
FIGS. 1a, 1b, 2, 3a, 3b and 4-8 show processing steps and respective structures in accordance with aspects of the present invention.

FIGS. 1a-8 show processing steps and resultant structures in accordance with embodiments of the invention. Specifically, FIG. 1a shows a structure 5 comprising a wafer 10. In embodiments, the wafer 10 may comprise a bulk silicon or silicon on insulator (SOI) wafer. In the SOI implementation, the wafer 10 comprises a substrate 10a, an insulation region 10b over the substrate 10a, and a semiconductor layer 10c (e.g., active silicon) over the insulation region 10b. In the bulk silicon implementation, reference numeral 10b can be representative of any isolation region or junction isolation.

More specifically, FIG. 1a shows an exemplary SOI wafer 10 employed as an intermediate structure in implementations of the invention. The SOI wafer 10 may be fabricated using techniques well know to those skilled in the art. For example, the SOI wafer 10 may be formed by conventional processes including, but not limited to, oxygen implantation (e.g., SIMOX), wafer bonding, etc.

The constituent materials of the SOI wafer 10 may be selected based on the desired end use application of the semiconductor device. For example, the substrate 10a may be composed of any suitable material including, but not limited to, Si, SiGe, SiGeC, SiC, GE alloys, GaAs, InAs, InP, and other III/V or II/VI compound semiconductors. The buried insulation region 10b may be composed of oxide, such as $SiO_2$, and may be referred to as BOX layer 10b. Moreover, although the SOI wafer is referred to as "silicon on insulator," the semiconductor layer 10c is not limited to silicon. Instead, the semiconductor layer 10c may be comprised of various semiconductor materials, such as, for example, Si, SiGe, SiC, SiGeC, etc.

In embodiments, the SOI wafer 10 has a thickness of about 700 μm, with the BOX layer 10b having a thickness of about 0.1-1.0 μm, and the semiconductor layer 10c having a thickness of about 0.050-0.400 μm. However, the invention is not limited to these dimensions, and the various portions of the SOI wafer may have any desired thicknesses based upon the intended use of the final semiconductor device.

In embodiments, shallow trench isolation (STI) structures 15 may be formed in portions of the wafer 10. The STI structures 15 can be formed in any conventional manner, such as, for example, masking portions of the semiconductor layer 10c, forming trenches in unmasked portions of the semiconductor layer 10c, filling the trenches with STI material, removing the mask, and planarizing the structure. In embodiments, the STI structures 15 are composed of oxide.

Figure 1B:
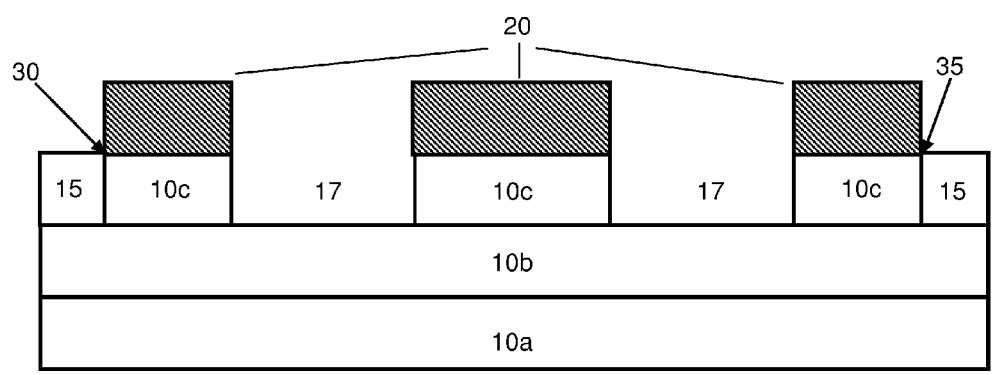

Referring to FIG. 1b, trenches 17 are formed in the semiconductor layer 10c. The trenches 17 may be formed using conventional semiconductor fabrication techniques, such as etching the semiconductor layer 10c through a mask 20, which may be a hard mask or a photoresist. For example, the mask 20 may be formed by applying a photoresist material on the semiconductor layer 10c and exposing and developing the photoresist material to form a pattern on the semiconductor layer. An etch process comprising a directional etch having a chemistry that selectively removes material of the semiconductor layer 10c may be performed to remove portions of the semiconductor layer 10c that are not protected by the mask 20, thereby forming trenches 17. The etch process may comprise a reactive ion etch (RIE), for example.

In particular, the patterning forms trenches 17 in the semiconductor layer 10c in order to open up areas that extend between outer regions 30 and 35 of the semiconductor layer 10c (e.g., regions that will later become a source and a drain) and a remaining central region of the semiconductor layer 10c, and to expose a surface of the BOX layer 10b.

Figure 2:
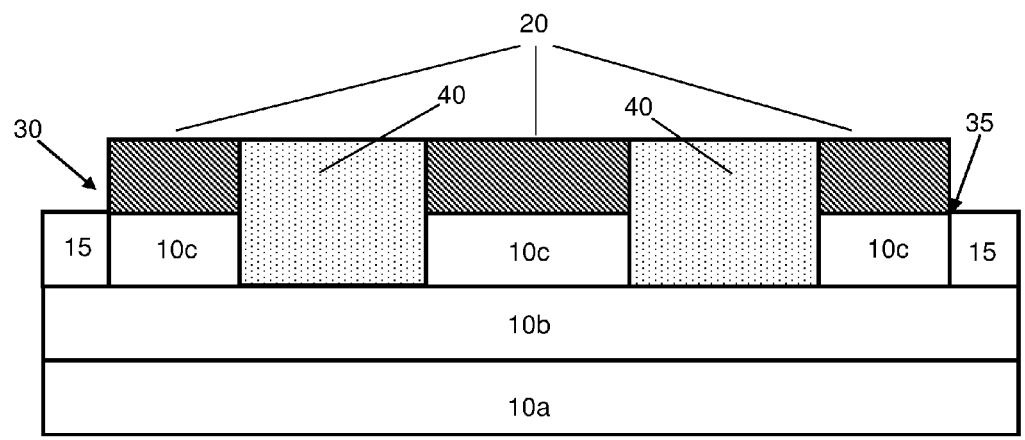

As shown in FIG. 2, an oxide layer 40 is formed in the trenches 17. The oxide layer 40 may be formed using any suitable technique, such as by epitaxially growing the oxide layer 40 from the exposed surface of the BOX layer 10b, in which case the oxide layer 40 will be composed of the same material as the BOX layer 10b (e.g., $SiO_2$). Alternatively, the oxide layer 40 may be formed by filling the trenches 17 using a deposition process. For example, the oxide layer 40 may be formed by depositing $SiO_2$, tetraethylorthosilicate (TEOS), or any other desired oxide, using a chemical vapor deposition (CVD) process, plasma-enhanced chemical vapor deposition (PECVD), TEOS deposition, thermal oxidation or any other suitable oxide-forming process. In embodiments, the oxide layer 40 is formed higher than an upper surface of the semiconductor layer 10c (e.g., to an upper edge of the mask 20) in order to ensure that the trenches 17 are completely filled.

Alternatively, the oxide layer 40 may be formed using an implantation process. For example, instead of forming the trenches 17, the oxide layer 40 can be formed in the semiconductor layer 10c by implanting exposed regions of the semiconductor layer 10c with oxygen and then subsequently laser annealing the implanted regions to form oxide layer 40.

Figure 3A:
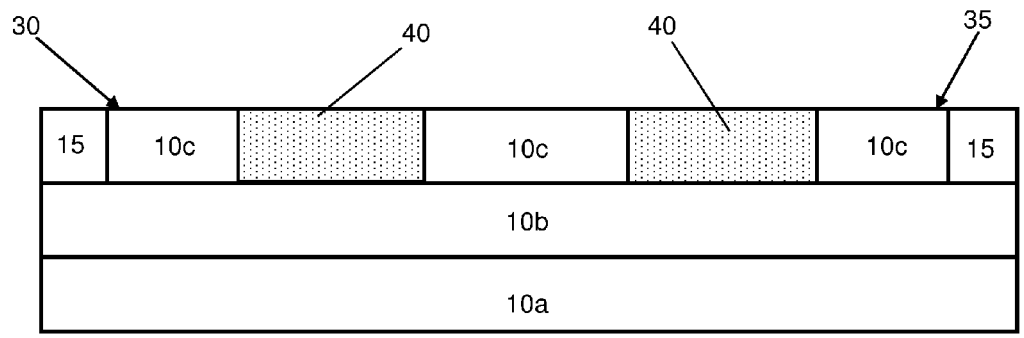

As depicted in FIG. 3a, the mask 20 is removed and the structure is planarized such that the oxide layer 40 is substantially co-planar with a top surface of the semiconductor layer 10c. For example, the mask 20 may be removed by a conventional stripping process and the planarizing may comprise using a chemical mechanical polishing (CMP) process.

Figure 3B:
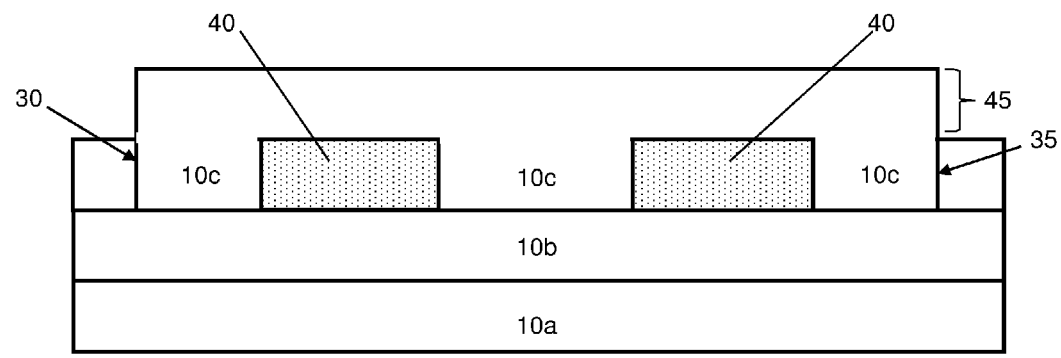

As depicted in FIG. 3b, an extension layer 45 (e.g., in embodiments also known as a resistor region) is formed on and over the semiconductor layer 10c and the oxide layer 40. In embodiments, the extension layer 45 is formed by epitaxially growing silicon from exposed surfaces of the semiconductor layer 10c. In particular, the silicon epitaxial growth occurs from the remaining central region of the semiconductor layer 10c and outer regions 30 and 35 to form the extension layer 45 above a top surface of the oxide layer 40. The thickness of the extension layer 45 may have any desired thicknesses based upon the intended use of the final semiconductor device.

Figure 4:
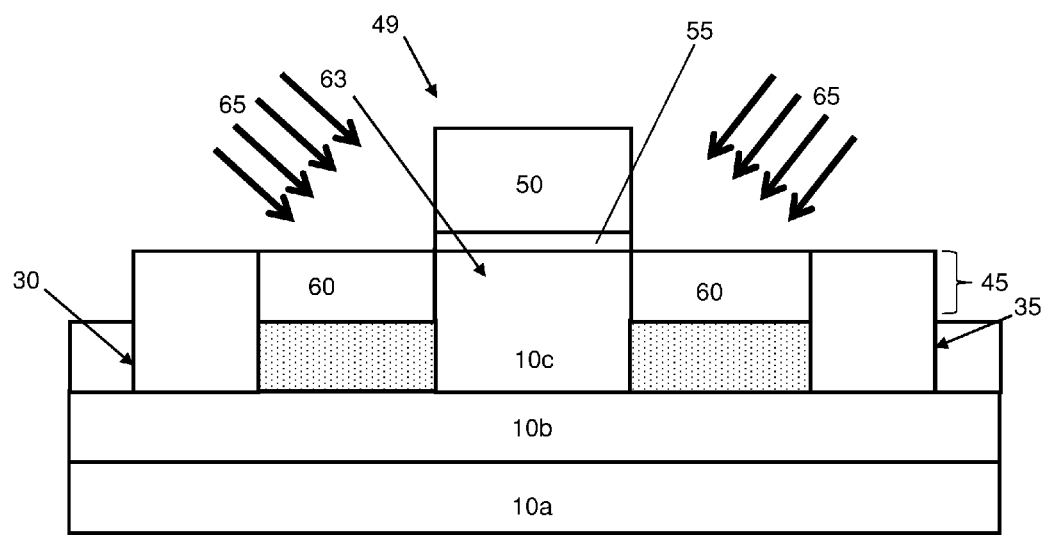

As shown in FIG. 4, a gate 49 is formed on the extension layer 45. For example, the gate 49 may comprise a gate body 50 and gate dielectric 55, and may be fabricated by first forming the gate dielectric 55 on an exposed surface (e.g., top) of the central region of semiconductor layer 10c. The gate dielectric layer 55 may be formed by any conventional deposition process such as CVD or PECVD, or a thermal growing process such as oxidation, nitridation or oxynitridation. The gate dielectric 55 may include any device quality dielectric material such as an oxide, nitride, oxynitride, hafnium oxide or other high-k dielectric, or any combination and multilayer thereof.

The gate body 50 may be formed on the gate dielectric 55 utilizing a conventional deposition process. The gate body 50 may include a gate material such as polysilicon, amorphous silicon or other materials suitable for MOSFET gate composition. The gate material may be formed on the surface of the gate dielectric 55 utilizing conventional deposition processes well known in the art such as, for example, CVD, PECVD and plating. The deposited gate dielectric material and gate material is patterned to form the gate 49.

As also shown in FIG. 4, the extension layer 45 may be doped or implanted to form extension regions 60 extending between a channel portion 63 of the semiconductor layer 10c and the outer regions 30 and 35. For example, an angled ion-implantation, represented by arrows 65, may be employed to selectively dope the extension regions 60 with appropriate ions depending on the desired doping type of the extension regions.

Figure 5:
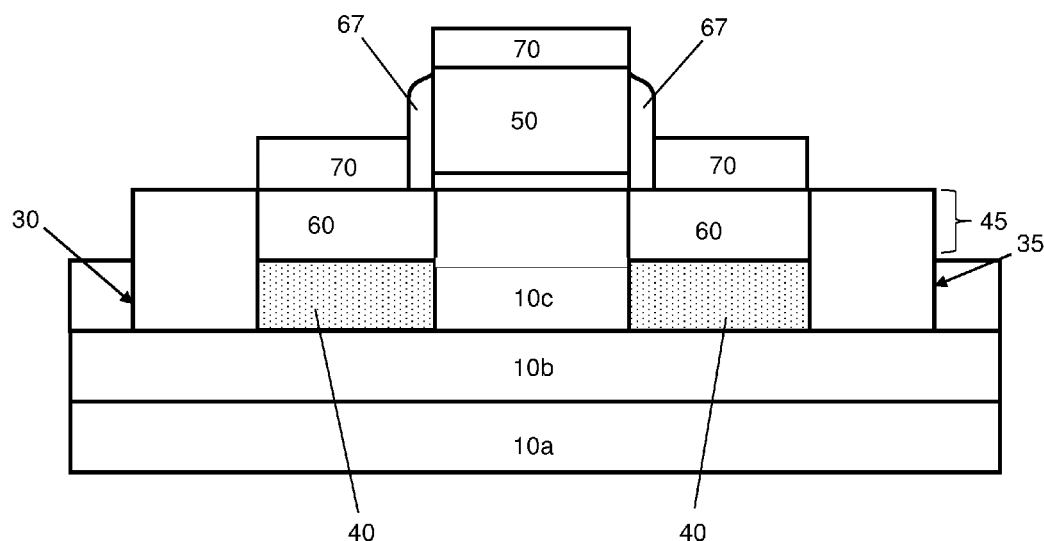

As shown in FIG. 5, sidewall spacers 67 and blocking structures 70 are formed on portions of the extension layer 45. For example, a dielectric material such as a nitride (e.g., $Si_3N_4$) may be selectively deposited on the surfaces of the gate body 50 and the extension layer 45 to form the sidewall spacers 67 and the blocking structures 70 in a conventional manner, such as by chemical vapor deposition CVD using a silane source. Other techniques, which may be suitable for deposition of a nitride layer, include low-pressure CVD (LPCVD) and atmospheric pressure CVD (APCVD). Portions of the deposited nitride layer are etched away in a conventional manner to form the sidewall spacers 67 along the gate body 50 sidewalls, and blocking structures 70 substantially aligned over the oxide layers 40. The sidewall spacers 67 and the blocking structures 70 are constructed in such a manner that they prevent subsequent silicide formation on the extension regions 60 overlying the oxide layers 40.

Figure 6:
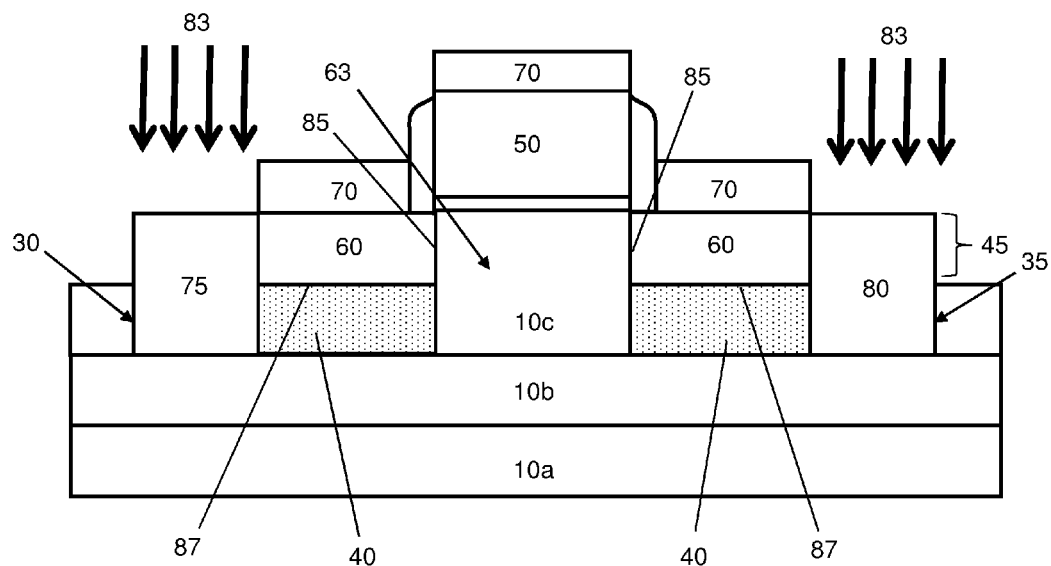

As shown in FIG. 6, source and drain regions 75 and 80 are formed in the outer regions 30 and 35 of the semiconductor layer 10c. The source and drain regions 75 and 80 may be formed using any suitable doping technique, such as ion-implantation, diffusion doping, and gas phase doping. For example, ion-implantation, shown by arrows 83, may be employed to selectively dope the source and drain regions 75 and 80 with appropriate ions depending on the desired doping type of the source and drain regions (e.g., n-type, p-type, etc.).

In embodiments, the semiconductor layer 10c is initially doped as P-type, and the source and drain regions 75 and 80 and the extension regions 60 are doped with N+ dopants. Further, the source and drain regions 75 and 80 may have a greater doping level (e.g., dopant concentration) as compared to the extension regions 60. In embodiments, the source and drain regions 75 and 80 are formed such that they abut opposite sides of the extension regions 60. However, the structure is not limited to this doping arrangement, and any other desired dopant types may be used within the scope of the invention.

Moreover, the invention is not limited by the order of steps to dope or implant the outer regions 30 and 35 and the extension layer 45. For example, the outer regions 30 and 35 can be doped first, and subsequently the extension layer 45 can be doped. Further, any desired implantation energy, dosage and implantation angle may be employed within the scope of the invention based upon the intended use of the final semiconductor device. For example, the outer regions 30 and 35 can be doped at an angle of about 90° relative to a surface of the outer regions 30 and 35 (e.g., a substantially vertical implant), and the extension layer 45 can be doped at a non-zero angle relative to vertical (e.g., about 45°).

Advantageously, as can be seen in FIG. 6, by thinning the semiconductor layer 10c and forming the oxide layer 40 in replacement of the removed silicon, an interface 85 between the extension regions 60 and the remaining central region of semiconductor layer 10c (e.g., the channel 63) is decreased. In particular, there is no interface between a bottom surface 87 of the extension regions 60 and the semiconductor layer 10c since the bottom surface 87 of the extension regions 60 abut the oxide layer 40 instead of the semiconductor layer 10c. Consequently, this design provides an increased sheet resistance and reduced capacitance in the ballasting region of the structure.

Figure 7:
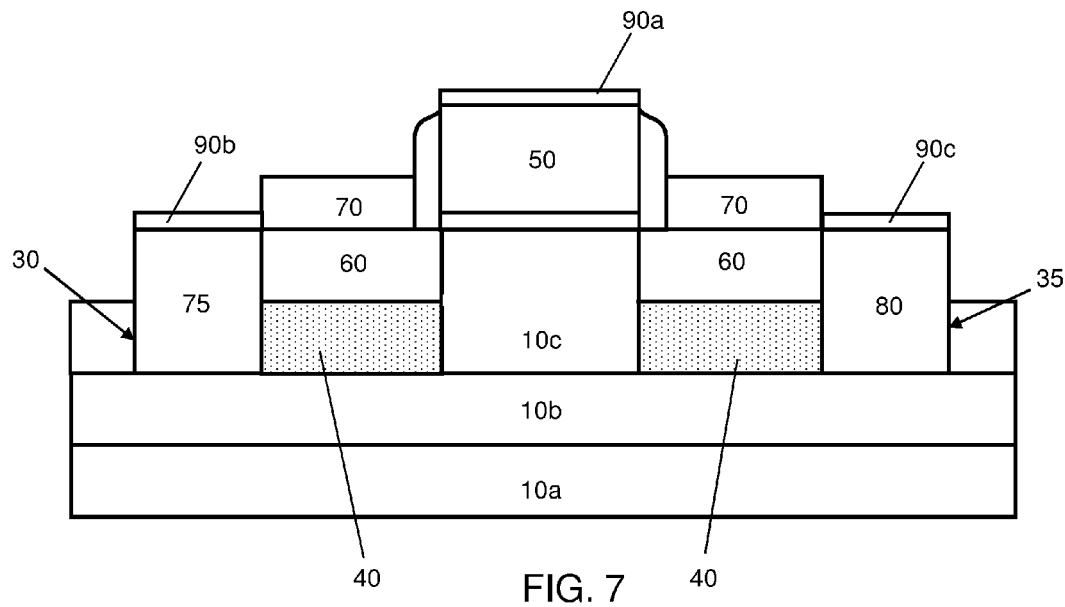

As shown in FIG. 7, advantageously, a portion of the blocking structures 70 may be selectively removed from the top of the gate body 50 by masking portions of the structure and etching away the portion of the blocking structure 70 on the top of the gate body 50 in a conventional manner. Silicide layers 90a, 90b and 90c may be formed on the gate body 50 and the source and drain regions 75 and 80 in any suitable manner. For example, the silicide layers 90a, 90b and 90c may be formed by selectively sputtering a Cobalt (or Nickel) film onto a top surface of the gate body 50 and a top surface of the source and drain regions 75 and 80, and annealing the film to form a Cobalt (or Nickel) silicide. The silicide layers 90a, 90b and 90c may have any desired thickness.

Even more advantageously, remaining portions of the blocking structures 70 prevent silicide from forming on the extension regions 60 during the silicide formation processes. Therefore, the resultant structure depicted in FIG. 7 is capable of maintaining an increased sheet resistance in the extension regions 60.

Figure 8:
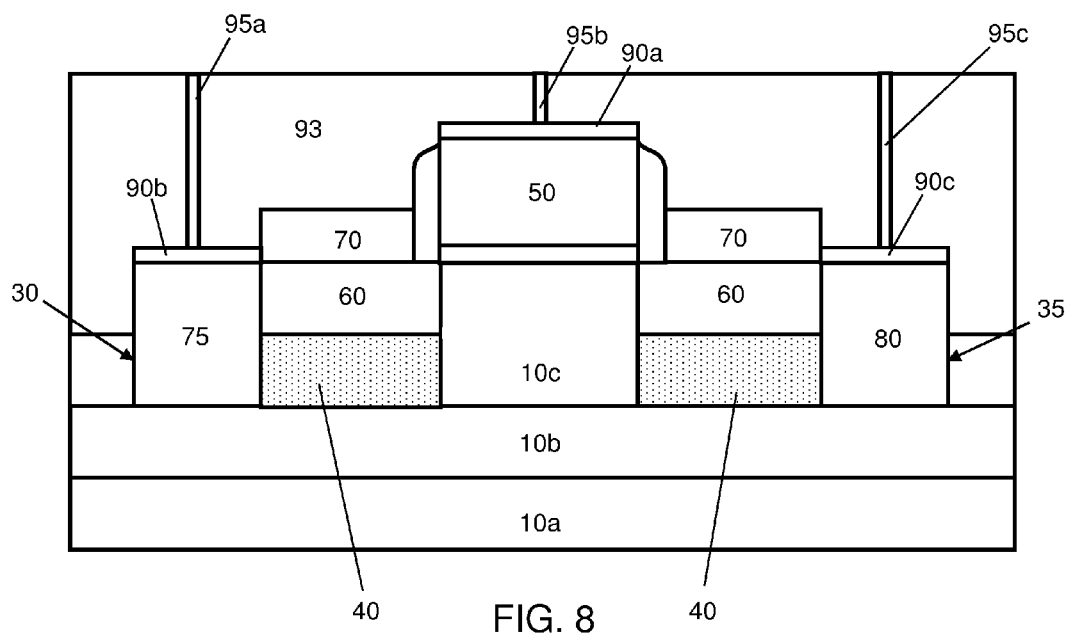

Middle-of-line (MOL) and/or back-end-of-line (BEOL) processes may be performed on the structure shown in FIG. 7. For example, as shown in FIG. 8, an interlevel dielectric (ILD) layer 93 may be deposited on the exposed surfaces and planarized. The ILD layer 93 may comprise any suitable dielectric material, for example, $SiO_2$, TEOS, borophosphosilicate glass (BPSG), high density plasma (HDP) oxide, etc. The ILD layer 93 may be deposited in any suitable manner such as CVD and may be planarized using CMP.

As further depicted in FIG. 8, contacts 95a, 95b and 95c may be formed in the ILD layer 93 to the gate, source, and drain regions. Any suitable contacts 90a, 90b and 90c may be formed using conventional materials and semiconductor fabrication techniques. For example, in embodiments, the contacts 95a, 95b and 95c comprise a liner and conductive material, and are formed by first forming contact holes in the ILD layer 93 down to, or slightly below, the upper surfaces of the gate body 50 and the source and drain regions 75 and 80. If silicide was previously formed on these features (e.g., silicide layer 90a, 90b and 90c), then the contact holes may be formed down to, or slightly below, the upper surface of the silicide. The liner is formed on the exposed surfaces of the contact holes. The liner may comprise, for example, Ta, TaN, Ti, TiN, Ru, RuN, W, WN, or any other material that can serve as a barrier to prevent conductive material from diffusing therethrough. Next, the contact holes are filled with a conductive material such as, for example, Cu, W, Al, Cu alloys, etc.

Figure 9A:
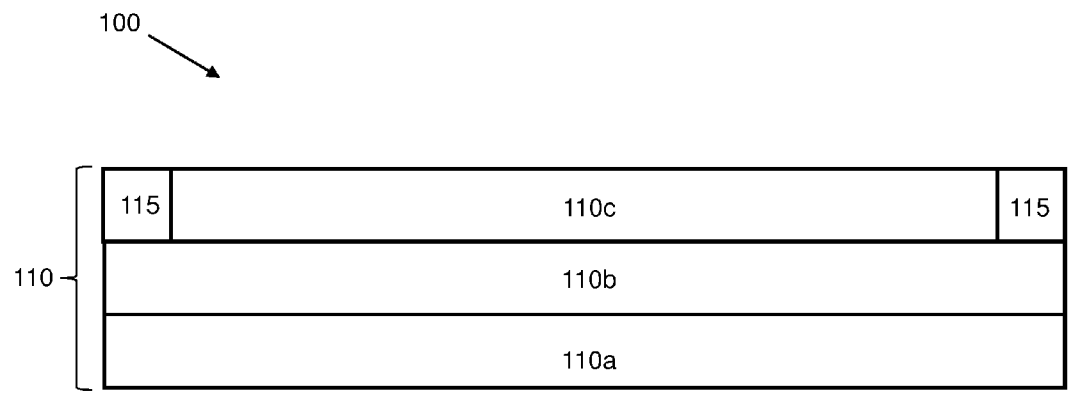
FIGS. 9a, 9b and 10-14 show processing steps and respective structures in accordance with additional aspects of the present invention.

FIGS. 9a-14 show processing steps and resultant structures in accordance with additional embodiments of the invention. Specifically, FIG. 9a shows a structure 100 comprising a wafer 110. The wafer 110 may be similar to wafer 10. For example, the wafer 110 may comprise a substrate 110a, buried insulator layer 110b, semiconductor layer 110c, and STI structures 115, similar to those described above with regard to structure 5.

Figure 9B:
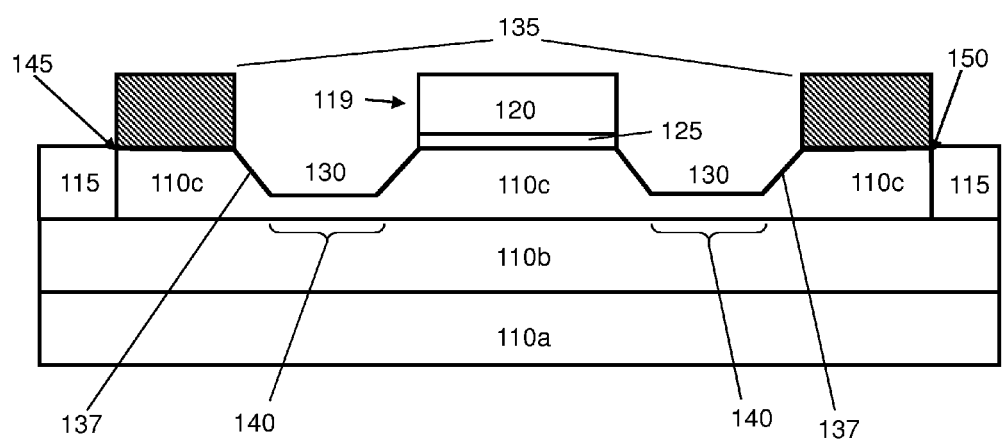

As depicted in FIG. 9b, a gate 119 comprising a gate body 120 and a gate dielectric 125 is formed over the semiconductor layer 110c. The gate 119 may be formed using conventional semiconductor fabrication processes and materials. For example, a gate dielectric 125 may be formed on an exposed surface (e.g., top) of the semiconductor layer 110c, as described above with regard to the gate dielectric 55. Subsequently, a layer of gate conductor may be formed on the gate dielectric 125 utilizing a conventional deposition process such as CVD, PECVD or plating, as described above with regard to gate body 50. The deposited gate dielectric material and gate conductor material may be patterned to form the gate 119.

As further depicted in FIG. 9b, angled trenches 130 are formed in the semiconductor layer 110c. The angled trenches 130 may be formed using conventional semiconductor fabrication techniques, such as etching the semiconductor layer 110c through a mask 135, e.g., in a manner similar to that described above with regard to trenches 17. The etch process may comprise a reactive ion etch (RIE), for example.

In embodiments, parameters of the etch process may be controlled to form sidewalls 137 of the angled trenches 130 at a predetermined angle and to construct the angled trenches 130 with a predetermined depth from a top surface of the semiconductor layer 110c. For example, gas concentration ratio (e.g., $O_2/(SF_6+O_2)$), electrode bias and chamber pressure of the RIE process may be controlled during the etch process to form the sidewalls 137 of the angled trenches 130 at a predetermined angle and to a predetermined depth relative to the top surface of the semiconductor layer 110c. The depth of the angled trenches 130, and consequently a thickness of a remaining portion of the semiconductor layer 110c, affects the resistance of the overall structure 100.

Accordingly, the patterning forms angled trenches 130 in the semiconductor layer 110c. In embodiments, the trenches 130 are over extension regions 140 (e.g., in embodiments also known as resistor regions) that extend between outer regions 145 and 150 (e.g., regions that will later become a source and a drain) and a remaining central region of the semiconductor layer 110c. Thus, the angled trenches 130 effectively thin the semiconductor layer 110c and advantageously provide an increased sheet resistance in the ballasting regions.

Advantageously, forming the gate body 120 prior to the angled trenches 130 permits the gate body 120 to be used as a mask for the etching process, which provides self-alignment of the angled trenches 130 relative to the gate body 120. Optionally, the mask 135 may cover the gate body 120 during etching process to protect the gate body 120. Alternatively, the gate body 120 may be a dummy gate that is used for self-alignment during etching, and which is later removed and replaced with a replacement gate. Alternatively, the angled trenches 130 may be formed prior to the gate body 120, which provides better ability to fill in the etched regions with oxide (described in greater detail below), but eliminates the benefit of self-alignment.

Figure 10:
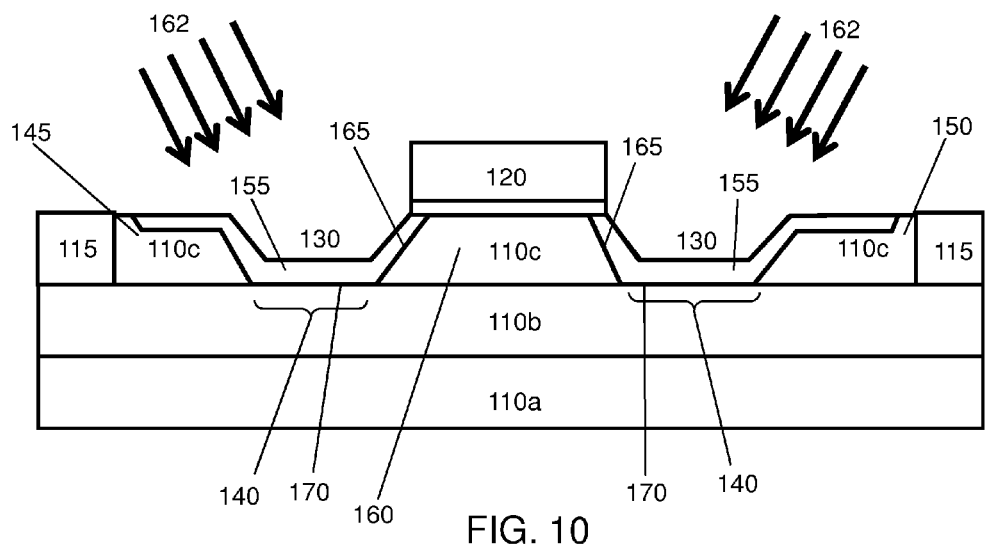

As shown in FIG. 10, the mask 135 is removed (e.g., stripped) and the extension regions 140 of the semiconductor layer 110c are doped to form extensions 155 between the channel 160 (e.g., p-well) and the outer regions 145 and 150. Any suitable doping technique may be used to form the extensions 155. For example, an ion implantation, such as a halo implant process, represented by reference number 162, may be employed to selectively dope the extension regions 140 of the semiconductor layer 110c with appropriate ions. Any desired implant energy, dose, and implant angle may be used based upon the intended use of the final semiconductor device. For example, the extension regions 140 can be doped at an angle of about 30° relative to a surface of the outer regions 145 and 150 at a dosage of 1E13-1E17 atoms per centimeter squared.

In embodiments, the semiconductor layer 110c is initially doped as P-type and the extension regions 140 are doped with N+ dopants. However, the structure 100 is not limited to this doping arrangement, and other dopant types may be used within the scope of the invention.

As can be seen in FIG. 10, there is an interface 165 between the doped extensions 155 and the channel 160. In accordance with aspects of the invention, the extent of the interface 165 is minimized because the bottom surface 170 of the doped extension 155 is formed directly on (e.g., abutting) the BOX layer 110b, e.g., instead of the bottom surface 170 being formed in contact with the channel 160 or other portion of semiconductor layer 110c. Consequently, this design provides an increased sheet resistance and reduced capacitance in the ballasting region of structure 100.

Figure 11:
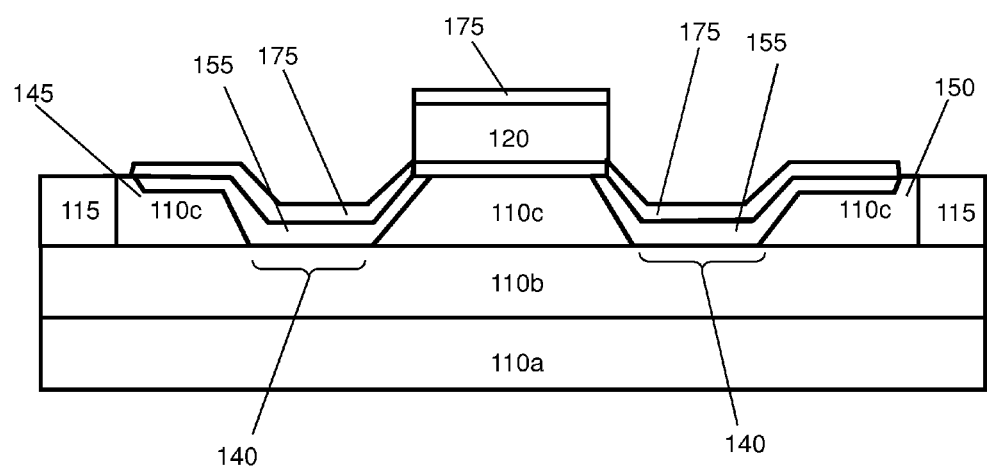

As shown in FIG. 11, blocking structures 175 are formed on portions of the extensions 155 and gate body 120. For example, a dielectric material such as a nitride (e.g., $Si_3N_4$) is selectively deposited to form the blocking structures 175 in a conventional manner, such as by CVD using a silane source. Other techniques, which may be suitable for deposition of a nitride layer, include LPCVD and APCVD. The blocking structures 175 are constructed in such a manner that they prevent subsequent source/drain implant and silicide formation in and over the extensions 155.

Figure 12:
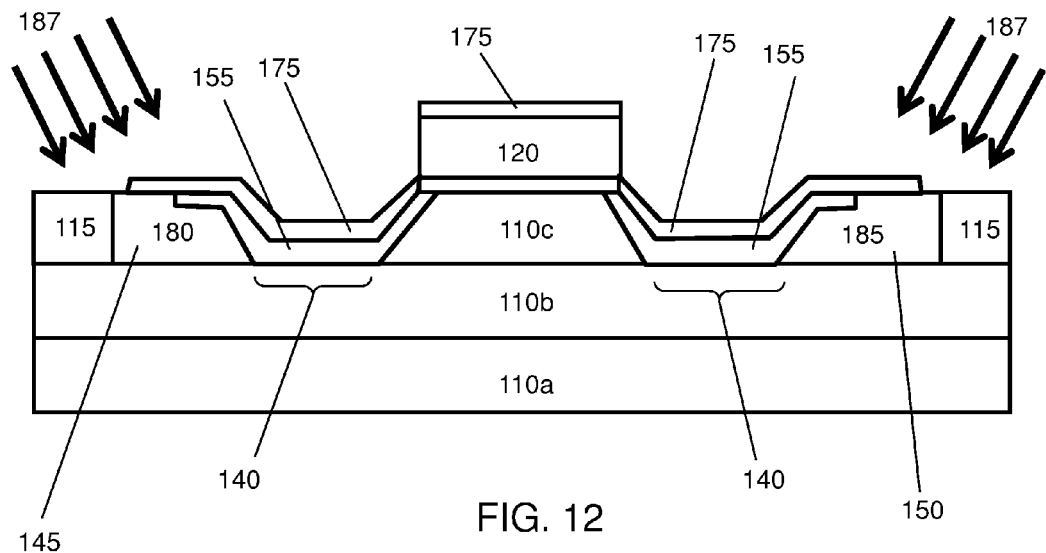

As shown in FIG. 12, source and drain regions 180 and 185 are formed in the outer regions 145 and 150 of the semiconductor layer 110c. Particularly, the source and drain regions 180 and 185 are formed such that they abut opposite sides of the extensions 155. The source and drain regions 180 and 185 may be formed using any suitable doping technique, such as ion-implantation, diffusion doping, and gas phase doping. For example, ion-implantation, shown by arrows 187, may be employed to selectively dope the source and drain regions 180 and 185 with appropriate ions depending on the desired doping type of the source and drain regions (e.g., n-type, p-type, etc.). Any desired implant energy, dose, and implant angle may be used based upon the intended use of the final semiconductor device. For example, the outer regions 145 and 150 can be doped at an angle of about 45-60° relative to a surface of the outer regions 145 and 150 at a dosage of 1E13 and 1E17 atoms per centimeter squared. Advantageously, the blocking structures 175 prevent the source and drain region implant from affecting the extensions 155.

As described above, in embodiments the semiconductor layer 110c may be initially doped as P-type, and the source and drain regions 180 and 185 and the extensions 155 are doped with N+ dopants. Further, the source and drain regions 180 and 185 may have a greater doping level as compared to the extensions 155. However, the structure 100 is not limited to this doping arrangement, and other dopant types may be used within the scope of the invention.

Figure 13:
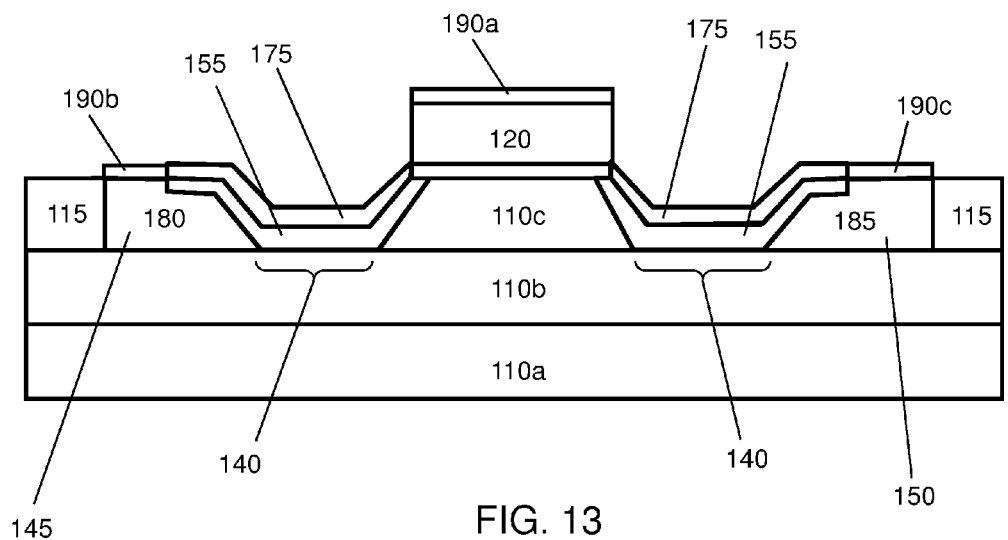

As shown in FIG. 13, advantageously, a portion of the blocking structures 175 may be selectively removed from the top of the gate body 120 by masking portions of the structure and etching away the portion of the blocking structures 175 on the top of the gate body 120 in a conventional manner. Portions of the blocking structures 175 overlying the source and drain regions 180 and 185 may also be removed in the same processing steps. Silicide layers 190a, 190b and 190c may be formed over the gate body 120 and the source and drain regions 180 and 185 in any suitable manner. For example, the silicide layers 190a, 190b and 190c may be formed by selectively sputtering a Cobalt (or Nickel) film onto a top surface of the gate body 120 and a top surface of the source and drain regions 180 and 185, and annealing the film to form a Cobalt (or Nickel) silicide. The silicide layers 190a, 190b and 190c may have any desired thickness.

Even more advantageously, remaining portions of the blocking structures 175 prevent silicide from forming on the extensions 155 during the silicide formation processes. This, in turn, prevents a decrease in sheet resistance that would occur if silicide were formed on the extensions 155. By preventing such a decrease in sheet resistance, implementations of the invention provide enhanced ESD protection for the device.

Figure 14:
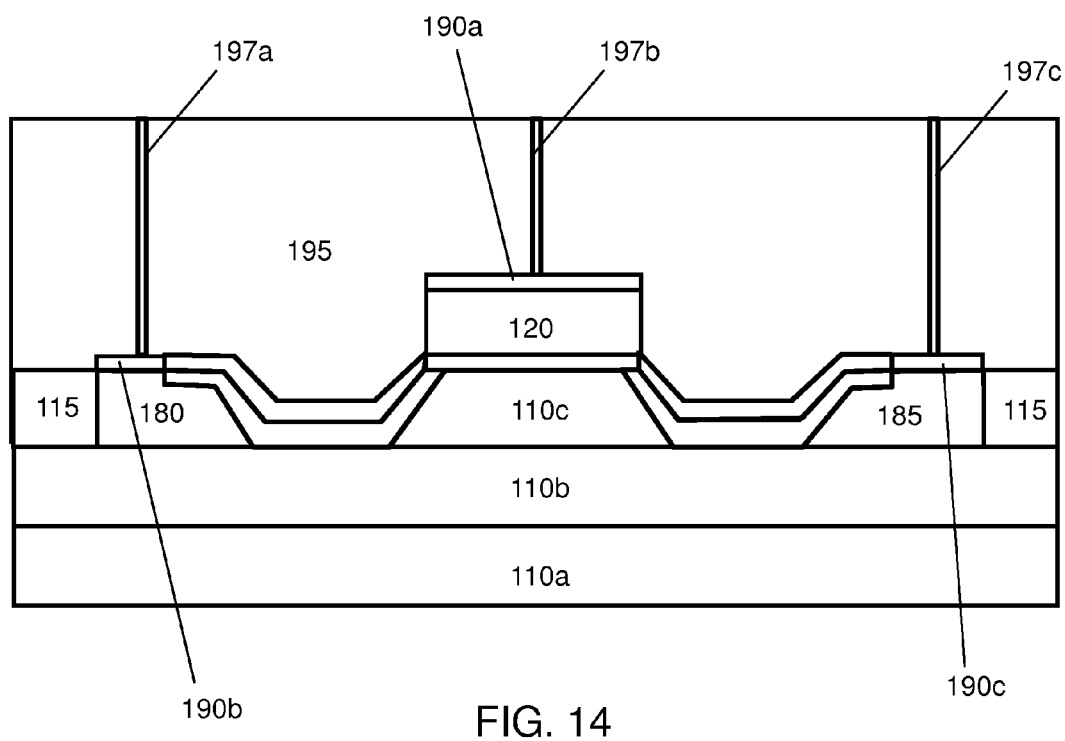

Middle-of-line (MOL) and/or back-end-of-line (BEOL) processes may be performed on the structure shown in FIG. 13, as described above with regard to structure 5. For example, as shown in FIG. 14, an interlevel dielectric (ILD) layer 195 may be deposited on the exposed surfaces and planarized and contacts 197a, 197b and 197c may be formed in the ILD layer 195.

Figure 15:
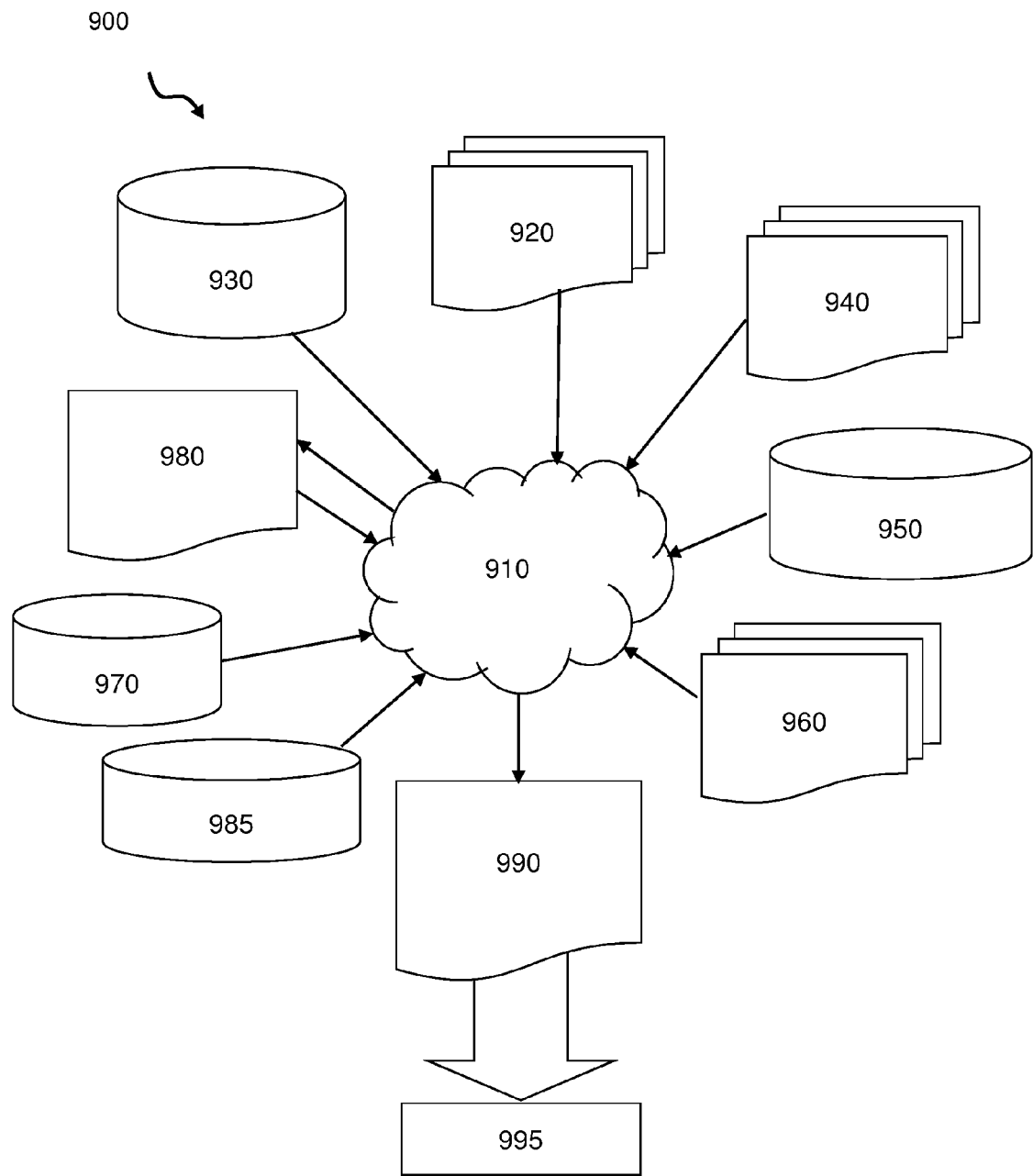
FIG. 15 is a flow diagram of a design process used in semiconductor design, manufacture, and/or test.

FIG. 15 is a flow diagram of a design process used in semiconductor design, manufacture, and/or test. FIG. 15 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1a-14. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 15 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1a-14. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1a-14 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1*a*-14. In one embodiment, design structure 990 may comprise a compiled, executable HDL simulation model that functionally simulates the devices shown in FIGS. 1*a*-14.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1*a*-14. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method of forming a semiconductor structure, comprising:
    forming a channel in a first portion of a semiconductor layer; and
    forming a doped extension region in a second portion of the semiconductor layer abutting the channel on a first side and abutting an insulator material on a bottom side,
    wherein the first portion of the semiconductor layer is thicker than the second portion of the semiconductor layer;
    the forming the channel comprises doping the first portion of the semiconductor layer with a first dopant type; and
    the forming the doped extension region comprises doping the second portion of the semiconductor layer with a second dopant type different from the first dopant type.

2. The method of claim 1, further comprising forming a source or a drain contacting a second side of the doped extension region opposite the first side.

3. A method of forming a semiconductor structure, comprising:
    forming a channel in a first portion of a semiconductor layer;
    forming a doped extension region in a second portion of the semiconductor layer abutting the channel on a first side and abutting an insulator material on a bottom side;
    forming a gate over the channel; and
    forming a silicide-blocking structure on the doped extension region,
    wherein the first portion of the semiconductor layer is thicker than the second portion of the semiconductor layer.

4. The method of claim 3, wherein a top of the gate is devoid of the silicide-blocking structure.

5. The method of claim 3, further comprising forming a silicide layer on the top of the gate.

6. A method of forming a semiconductor structure, comprising:
    providing a silicon on insulator substrate comprising the semiconductor layer and a buried oxide layer;
    forming a first and second trench in the semiconductor layer;
    forming a channel in a first portion of the semiconductor layer, the first and the second trench being on opposite sides of the channel and extending from a top surface of the semiconductor layer to a top surface of the buried oxide layer;
    forming an oxide layer in the first and the second trench on the top surface of the buried oxide layer;
    forming a gate dielectric over the channel;
    forming a gate on the gate dielectric;
    forming a doped extension region in a second portion of the semiconductor layer abutting the channel on a first side and abutting the oxide layer on a bottom side;
    forming sidewall spacers on opposite sidewalls of the gate;
    forming a silicide-blocking structure on the doped extension region; and
    forming a silicide layer on a top surface of the gate, wherein the first portion of the semiconductor layer is thicker than the second portion of the semiconductor layer.

7. The method of claim 6, wherein opposite sidewalls of the first and the second trench are substantially perpendicular to the top surface of the buried oxide layer.

8. A method of forming a semiconductor structure, comprising:
providing a silicon on insulator substrate comprising atm semiconductor layer and a buried oxide layer;
forming a first and second trench in the semiconductor layer such that opposite sidewalls of the first and the second trench taper inward from a top surface of the semiconductor layer to a bottom surface of the first and the second trench;
forming a channel in a first portion of the semiconductor layer, the first and the second trench being on opposite sides of the channel and extending partially into the semiconductor layer from the top surface of the semiconductor layer;
forming a gate dielectric over the channel;
forming a gate on the gate dielectric;
forming a doped extension region in a second portion of the semiconductor layer abutting the channel on a first side and abutting an insulator material on a bottom side;
forming a silicide-blocking structure on the doped extension region; and
forming a silicide layer on a top surface of the gate,
wherein the forming the doped extension region comprises doping the opposite sidewalls and the bottom surface of the first and the second trench; and
the first portion of the semiconductor layer is thicker than the second portion of the semiconductor layer.

9. A method of forming a semiconductor structure, comprising:
forming a channel in a first portion of a semiconductor layer under a gate of a field effect transistor (FET);
forming a source and a drain in the semiconductor layer;
forming a first doped extension region in a second portion of the semiconductor layer, on an insulator material, and abutting the channel and the source;
forming a second doped extension region in a third portion of the semiconductor layer, on the insulator material, and abutting the channel and the drain; and
wherein the first portion of the semiconductor layer is thicker than the second and third portions of the semiconductor layer;
the channel comprises a first dopant type;
the first doped extension region and the second doped extension region comprise a second dopant type different from the first dopant type; and
the source and the drain comprise the second dopant type.

10. The method of claim 9, wherein a doping level of the second dopant type of the source and the drain is greater than a doping level of the second doping type of the first doped extension region and the second doped extension region.

11. A method of forming a semiconductor structure, comprising:
forming a channel in a first portion of a semiconductor layer under a gate of a field effect transistor (FET);
forming a source and a drain in the semiconductor layer;
forming a first doped extension region in a second portion of the semiconductor layer, on an insulator material, and abutting the channel and the source;
forming a second doped extension region in a third portion of the semiconductor layer, on the insulator material, and abutting the channel and the drain;
forming a silicide-blocking structure on the first doped extension region and the second doped extension region, wherein a top of the gate, a top of the source and a top of the drain is devoid of the silicide-blocking structure, and
forming a silicide layer on the top of the gate, the top of the source and the top of the drain
wherein the first portion of the semiconductor layer is thicker than the second and third portions of the semiconductor layer.

12. A method of forming a semiconductor structure, comprising:
providing a silicon on insulator substrate comprising the semiconductor layer and a buried oxide layer;
forming a first and second trench in the semiconductor layer;
forming a channel in a first portion of a semiconductor layer under a gate of a field effect transistor (FET), the first and the second trench being on opposite sides of the channel and extending from a top surface of the semiconductor layer to a top surface of the buried oxide layer;
forming an oxide layer in the first and the second trench on the top surface of the buried oxide layer;
forming a gate dielectric over the channel;
forming the gate on the gate dielectric;
forming a source and a drain in the semiconductor layer;
forming a first doped extension region in a second portion of the semiconductor layer, on the oxide layer, and abutting the channel and the source;
forming a second doped extension region in a third portion of the semiconductor layer, on the oxide layer, and abutting the channel and the drain;
forming sidewall spacers on opposite sidewalls of the gate;
forming a silicide-blocking structure on the first doped extension region and the second doped extension region; and
forming a silicide layer on a top surface of the gate,
wherein the first portion of the semiconductor layer is thicker than the second and third portions of the semiconductor layer.

13. The method of claim 12, wherein opposite sidewalls of the first and the second trench are substantially perpendicular to the top surface of the buried oxide layer.

14. A method of forming a semiconductor structure, comprising:
providing a silicon on insulator substrate comprising a semiconductor layer and a buried oxide layer;
forming a first and second trench in the semiconductor layer such that opposite sidewalls of the first and the second trench taper inward from a top surface of the semiconductor layer to a bottom surface of the first and the second trench;
forming a channel in a first portion of the semiconductor layer under a gate of a field effect transistor (FET), the first and the second trench being on opposite sides of the channel and extending partially into the semiconductor layer from the top surface of the semiconductor layer;
forming a gate dielectric over the channel;
forming the gate on the gate dielectric;
forming a source and a drain in the semiconductor layer;
forming a first doped extension region in a second portion of the semiconductor layer, on an insulator material, and abutting the channel and the source;
forming a second doped extension region in a third portion of the semiconductor layer, on the insulator material, and abutting the channel and the drain; and forming a silicide-blocking structure on the first doped extension region and the second doped extension region; and forming a silicide layer on a top surface of the gate, wherein the forming the first doped extension region comprises implanting the first doped extension region into the opposite sidewalls and the bottom surface of the first trench;

the forming the second doped extension region comprises implanting the second doped extension region into the opposite sidewalls and the bottom surface of the second trench; and the first portion of the semiconductor layer is thicker than the second and third portions of the semiconductor layer.

15. The method of claim 14, wherein:

the channel comprises a first dopant type;

the first doped extension region and the second doped extension region comprise a second dopant type different from the first dopant type; and the source and the drain comprise the second dopant type.

* * * * *